United States Patent
Jang

(10) Patent No.: US 7,237,581 B2
(45) Date of Patent: Jul. 3, 2007

(54) APPARATUS AND METHOD OF DISPENSING PHOTOSENSITIVE SOLUTION IN SEMICONDUCTOR DEVICE FABRICATION EQUIPMENT

(75) Inventor: Sung-Kun Jang, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 172 days.

(21) Appl. No.: 11/045,062

(22) Filed: Jan. 31, 2005

(65) Prior Publication Data

US 2005/0224132 A1     Oct. 13, 2005

(30) Foreign Application Priority Data

Apr. 7, 2004     (KR)    ................. 10-2004-0023628

(51) Int. Cl.
    *B65B 1/04*     (2006.01)
(52) U.S. Cl. ............... 141/286; 141/67; 141/94; 96/175; 417/26
(58) Field of Classification Search ............... 141/286, 141/67, 98, 94; 118/712; 417/26; 96/175
    See application file for complete search history.

(56) References Cited

U.S. PATENT DOCUMENTS

| | | | |
|---|---|---|---|
| 4,153,902 A * | 5/1979 | Kanayama | ................. 347/92 |
| 5,814,151 A | 9/1998 | Lee et al. | |
| 6,355,105 B1 | 3/2002 | Tuan | |
| 6,402,821 B1 * | 6/2002 | Matsuyama | ................. 96/175 |
| 7,029,238 B1 * | 4/2006 | Zagars et al. | ................. 417/26 |
| 2004/0011285 A1 | 1/2004 | Tzeng et al. | |

* cited by examiner

*Primary Examiner*—Steven O. Douglas
(74) *Attorney, Agent, or Firm*—Volentine & Whitt, PLLC

(57) ABSTRACT

A method of and apparatus for dispensing photosensitive solution substantially reduces the amount of air bubbles in the photosensitive solution during the dispensing operation. The photosensitive solution dispensing apparatus includes at least one supply vessel that contains the solution, a respective buffer tank that buffers the solution supplied from each supply vessel, a filter unit for filtering the solution, a pump for pumping the solution pumped from the buffer tank to the filter unit, a dispensing nozzle connected to the filter unit, and a dedicated bubble removal filter that is interposed between the buffer tank and the pump. The bubble removal filter is configured to remove air bubbles from the solution before the solution flows into the pump and is dispensed through the nozzle.

9 Claims, 4 Drawing Sheets

APPARATUS AND METHOD OF DISPENSING PHOTOSENSITIVE SOLUTION IN SEMICONDUCTOR DEVICE FABRICATION EQUIPMENT

BACKGROUND OF THE INVENTION

1. Field of the Invention

The present invention relates to semiconductor manufacturing equipment. More particularly, the present invention relates to an apparatus and method of dispensing photosensitive solution, such as photoresist, onto a semiconductor wafer.

2. Description of the Related Art

The recent rapid development of information processors, such as computers, has brought about remarkable advances in semiconductor devices, e.g., in semiconductor memory devices. These devices must be highly integrated if they are to be competitive in the marketplace, i.e., if they are to be of high quality yet low in cost to manufacture. One way to achieve a high degree of integration in a semiconductor device is to scale down components of the device. For example, the thickness of a gate oxide or the channel length of a transistor of the device can be reduced. To meet the current demand for high-performance devices, semiconductor manufacturing processes and manufacturing equipment must, therefore, be continuously improved. That is, the performance of semiconductor device manufacturing equipment is becoming increasingly more important.

In general, the manufacturing of semiconductor devices entails forming numerous patterns on a wafer. Accordingly, semiconductor manufacturing equipment includes a transfer robot for transferring wafers throughout the equipment, a coater for coating the wafers with photosensitive solution, a bake unit for baking the photosensitive solution on the wafers such that a layer of photosensitive material is formed on the wafers, an aligner for orienting the wafers to a predetermined position, an exposure unit for exposing the photosensitive material to light directed through a photomask or reticle bearing a pattern, a developing unit for developing the exposed photosensitive layer such that the photosensitive layer is patterned, and an etching unit for etching a target layer on the wafer using the photosensitive layer pattern as an etch mask. As a result, the target layer is patterned in correspondence with a pattern borne by the photomask or reticle.

A coater of the semiconductor manufacturing equipment includes photosensitive solution dispensing apparatus having a configuration as generally shown in FIG. 1. More specifically, the photosensitive solution dispensing apparatus includes supply vessels 10 and 11 for storing photosensitive solution such as photoresist, first and second tanks 20 and 21 for buffering the photosensitive solution supplied from the supply vessels 10 and 11 so as to uniformly dispense photosensitive solution, a pump 42 for pumping photosensitive solution from the first and second tanks 20 and 21, a filter unit 47 including filters 48 and 49 for removing air bubbles from the photosensitive solution, and a nozzle 52 for spraying the filtered photosensitive solution onto a surface of a wafer 60 while the wafer 60 is rotated. Also, a drain line extends from the filter unit 47 and a drain valve 50 allows for solution to be drained from the filter unit 47.

The photosensitive solution dispensing apparatus also includes several other lines/pipes 15, 16, 23, 24, 30, 31, 37, 38, 40, 44 and 45 through which the photosensitive solution can flow, and valves 27, 28, 33, 34 and 50 that control the flow of the photosensitive solution through the apparatus. Lines 15 and 16 extend, respectively, between supply vessels 10 and 11 and first and second tanks 20 and 21. Lines 23 and 24 are drain lines used to discharge photosensitive solution and air from each the first and second tanks 20 and 21, respectively. The valves 27 and 28 are provided in the lines 23 and 24 to control the draining of the first and second tanks 20 and 21. Solution stored in each of first and second tanks 20 and 21 is supplied to an inflow line 40 of the pump 42 through lines 30, 31, 37 and 38. Valves 33 and 34 are disposed in the lines 30 and 31, respectively, and are positionable to selectively allow or prevent the flow of solution from the tanks 20 and 21 to the inflow line 40. Line 44 extends between the pump 42 and filter unit 47, and photosensitive solution filtered by the filter unit 47 flows to the nozzle 52 through outlet line 45.

In addition, the photosensitive solution dispensing apparatus includes sensors 18 and 19 for sensing air bubbles within the first and second tanks 20 and 21, respectively. Each of the sensors 18, 19 includes a light emitting part (light emitter) and a light receiving part (light receptor).

Photosensitive solution, such as photoresist, is supplied from the supply vessels 10 and 11 onto the wafer 60 through nozzle 52, as follows.

In the case in which photosensitive solution stored in supply vessel 10 is to be dispensed onto the wafer 60, valve 34 is closed, and valve 33 is opened. The opening/closing of the valves 33 and 34 is automatically controlled by a controller of the photosensitive solution dispensing apparatus. Next, the pump 42 is driven to draw photosensitive solution temporarily stored in the first tank 20 through lines 30, 37 and 40. From there, the photosensitive solution is pumped to the filter unit 47 through line 44. The photosensitive solution filtered in the filter unit 47 is outputted to line 45 and hence, is dispensed by the nozzle 52 onto wafer 60.

Accordingly, the amount of photosensitive solution stored in the supply vessel 10 is gradually reduced. Eventually, air bubbles start to fill the first tank 20. The sensor 18 generates a signal once a predetermined volume of the tank 20 becomes occupied by the air bubbles. At this time the supply vessel 10 must be changed. Accordingly, the controller generates a control signal that opens valve 34 and closes valve 33. While the valve 34 is opening, nitrogen gas is introduced into the supply vessel 11 through line 14. The pressure of the nitrogen gas discharges bubbles existing in the line 16 and second tank 21 through line 24 and drain valve 28. However, micro bubbles may flow into line 44 through the pump 42 because the pressure of the nitrogen gas may not be sufficient to discharge the micro bubbles through the line 24 and drain valve 28. Thus, the photosensitive solution discharged through nozzle 52 may contain bubbles. In this case, the photosensitive layer formed on the wafer 60 may be defective.

More specifically, with reference to FIG. 2, although some of the micro bubbles are discharged through drain valve 28, most of the micro bubbles MA remain in the tank 21. These micro bubbles MA are entrained in the photosensitive solution and thereby migrate to the pump 42 through line 30, valve 33 and line 37. Eventually, the micro bubbles diffuse within the photosensitive solution in line 44 (FIG. 1), and then gradually accumulate within the filter unit 47. Hence, bubbles are mixed with the photosensitive solution discharged through the nozzle 52, thereby reducing the volume of solution that is being dispensed. As a result, the quality of the photosensitive layer is adversely affected. Such a defect in the photosensitive layer may give rise to errors in subsequent steps of the photolithographic process.

SUMMARY OF THE INVENTION

Accordingly, an object of the present invention is to provide a photosensitive solution dispensing method and apparatus for substantially reducing air bubbles in a solution that is dispensed onto a substrate in a deposition process.

Another object of the present invention is to provide a method and apparatus that substantially reduce the amount of micro bubbles flowing into a pump when a supply vessel containing the solution is depleted and is changed.

According to one aspect of the present invention, a chemical solution dispensing apparatus includes at least one supply vessel for storing a chemical solution, a respective buffer tank that buffers the solution supplied from each supply vessel so that the solution can be dispensed uniformly, a pump for pumping the solution from each buffer tank, a filter unit to which the solution is pumped, and a bubble removal filter that is connected between the buffer tank and the pump for removing air bubbles from the photosensitive solution. Accordingly, bubbles are prevented from passing into an inflow line of the pump part.

The chemical solution may be a photosensitive solution such as photoresist. Also, a bubble sensor for detecting air bubbles may be installed in each buffer tank. The bubble sensor may be a contact type of proximity sensor capable of detecting air bubbles in the buffer tank. In addition, a valve may be provided in line between the bubble removal filter and the pump. Preferably, the valve is an automatically actuatable valve that is automatically opened or closed when the supply vessel is changed.

According to another aspect of the invention, a chemical solution dispensing method includes buffering a chemical solution supplied in at least one buffer tank, pumping the solution from the buffer tank via an outlet of the tank, filtering bubbles out of the solution that has been pumped from the buffer tank, and subsequently filtering the solution, and dispensing the filtered solution onto a substrate.

According to the invention, the amount of air bubbles in the solution, e.g. in a photosensitive solution, is substantially reduced during the process of depositing the photosensitive solution on a wafer or the like. Thus, a uniform layer of photosensitive material can be formed on the wafer. As a result, there is less likelihood that the layer will become a cause of defects in a pattern formed on the wafer when the layer is patterned and used as an etch mask.

BRIEF DESCRIPTION OF THE DRAWINGS

The present invention will become more fully understood from the detailed description made below with reference to the accompanying drawings, wherein.

DETAILED DESCRIPTION OF THE PREFERRED EMBODIMENTS

Figure 1:
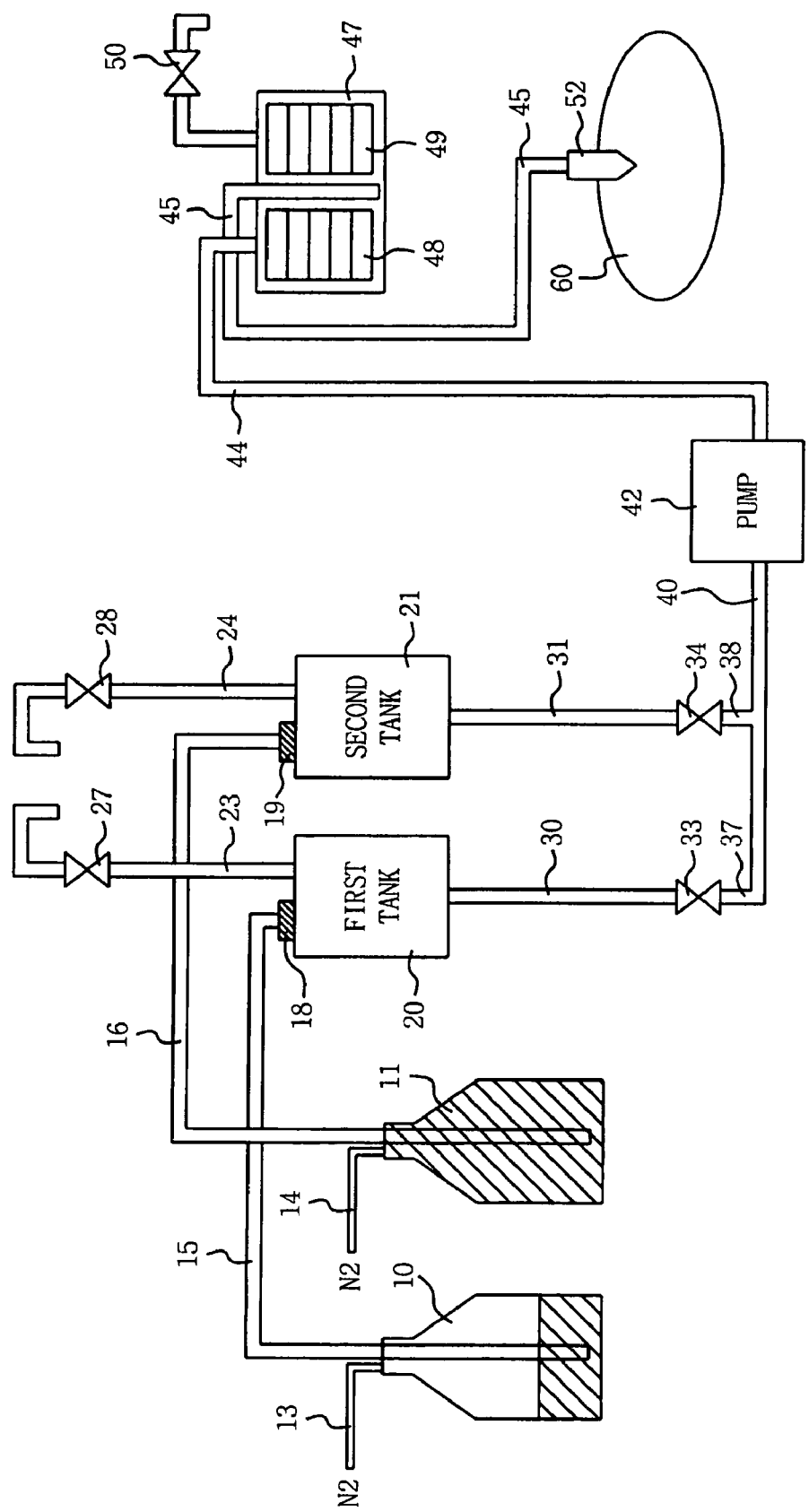
FIG. 1 is a schematic diagram of a conventional photosensitive solution dispensing apparatus.
Figure 2:
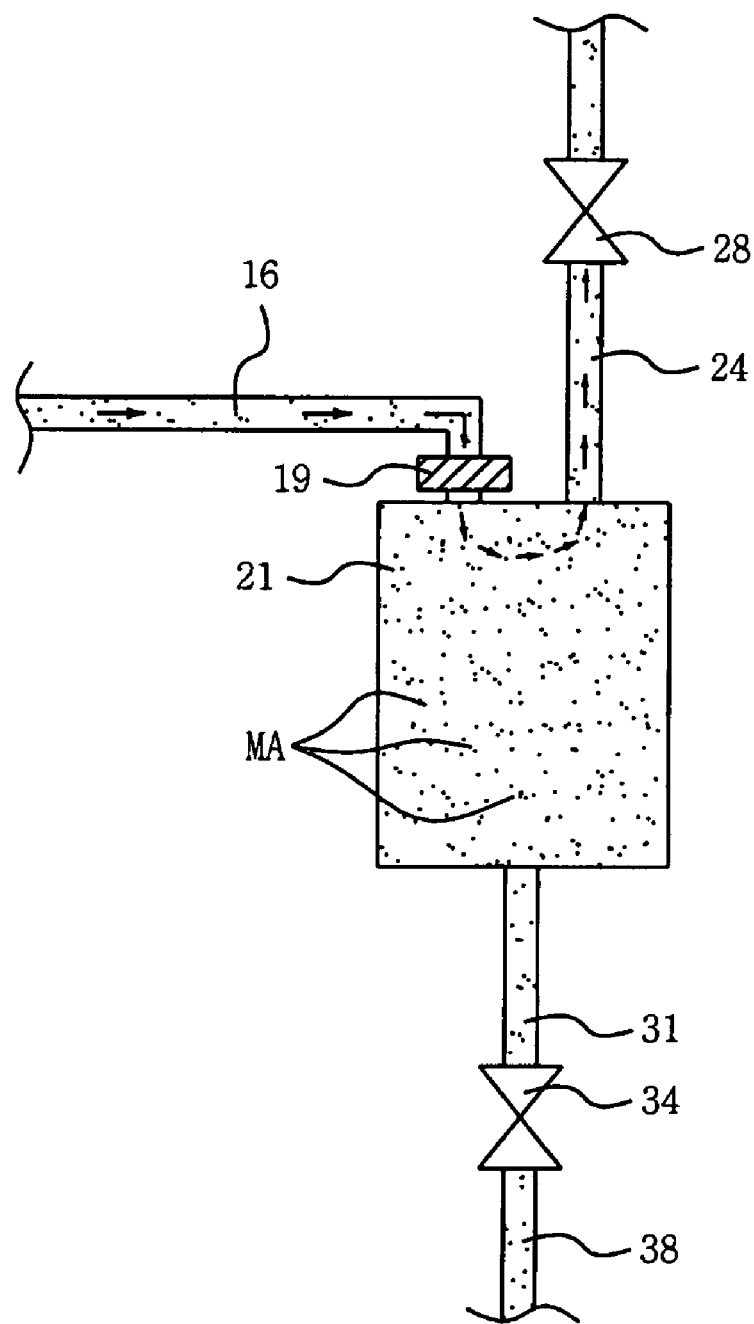
FIG. 2 is a schematic diagram of a section of the conventional photosensitive solution dispensing apparatus which includes a buffer tank of the apparatus.

The present invention will be described in detail with reference to FIGS. 3 and 4. Like reference numerals are used to designate like elements throughout the drawings.

Figure 3:
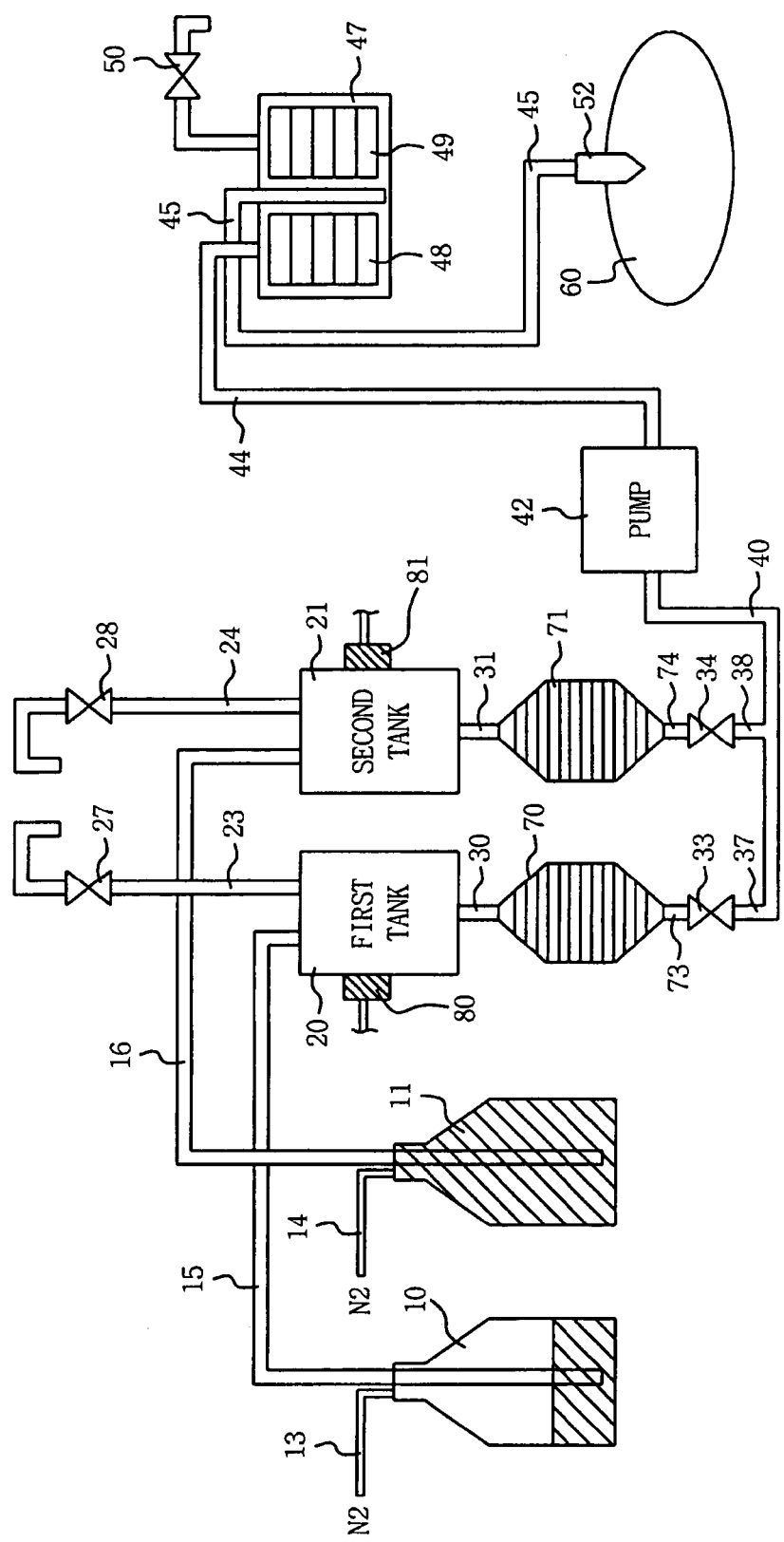
FIG. 3 is a schematic diagram of a photosensitive solution dispensing apparatus according to the present invention.
Figure 4:
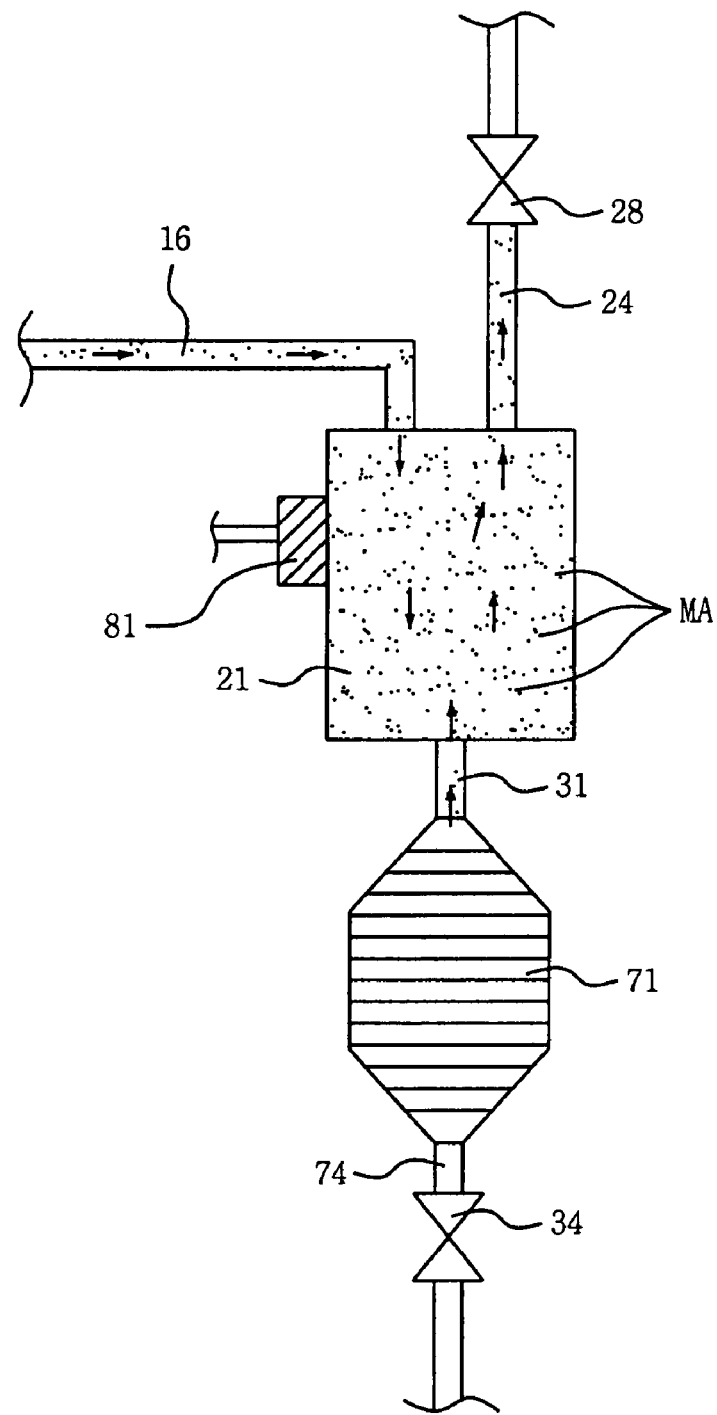
FIG. 4 is a schematic diagram of a section of the photosensitive solution dispensing apparatus according to the present invention, and which section includes a buffer tank of the apparatus.

Referring first to FIG. 3, the photosensitive solution dispensing apparatus has a configuration similar to that of the prior art shown in FIG. 1 and so, only a portion of the photosensitive solution dispensing apparatus will be described again. Briefly, the photosensitive solution dispensing apparatus includes supply vessels 10 and 11, first and second tanks 20 and 21, a pump 42, a filter unit 47 including filters 48 and 49, and a nozzle 52. Similarly, lines 15 and 16 extend between and connect the supply vessels 10 and 11 and the first and second buffer tanks 20 and 21, respectively. Lines 23 and 24 and drain valves 27 and 28 are provided for discharging air and photosensitive solution from the first and second tanks 20 and 21.

In addition, though, the photosensitive solution dispensing apparatus also includes bubble removal filters 70 and 71, and bubble sensors 80 and 81.

The bubble sensors 80 and 81 are each a contact type of proximity sensor for detecting bubbles in the first and second tanks 20 and 21, respectively.

The bubble removal filters 70 and 71 are connected between the first and second buffer tanks 20 and 21 and the pump 42, respectively. The bubble removal filters 70 and 71 filter air bubbles from the photosensitive solution flowing from the tanks 20 and 21 via lines 30 and 31, respectively. Thus, the bubble removal filters 70 and 71 prevent bubbles from passing into the inflow line 40 of the pump 42.

Lines 73 and 74 extend from the bubble removal filters 70 and 71. Valves 33 and 34 are disposed in-line between the lines 73 and 74 and the lines 37 and 38, respectively. Photosensitive solution thus flows from the tanks 20 and 21 to the inflow line 40 of the pump 42 via lines 73 and 74, valves 33 and 34, and lines 37 and 38. Similar, to the prior art of FIG. 1, a line 44 connects the pump 42 to the filter unit 47, and a line 45 connects the filter unit 47 to nozzle 52.

The photosensitive solution, such as photoresist, stored in the supply vessels 10 and 11 is dispensed onto a wafer 60 through nozzle 52 as follows.

In the case in which photosensitive solution stored in supply vessel 10 is dispensed onto wafer 60, the valve 34 is closed and the 33 is opened. The opening/closing of the valves 33 and 34 is automatically controlled by a controller of the photosensitive solution dispensing apparatus. Then, the pump 42 is driven so that photosensitive solution stored in the first buffer tank 20 is drawn into the inflow line 40 of the pump 42 through line 30, bubble removal filter 70 and lines 73 and 37. From there, the photosensitive solution is pumped by to the filter unit 47 through line 44. The photosensitive solution is filtered by the filter 48 of the filter unit. The filtered photosensitive solution is output to the line 45, and is dispensed onto the wafer 60 by the nozzle 52.

Hence, the amount of photosensitive solution in the supply vessel 10 is gradually reduced. Eventually, bubbles start to fill the first buffer tank 20. The bubble sensor 80 generates a signal when the bubbles exceed a predetermined volume in the tank 20. At this time, the supply vessel 10 is to be changed. Hence, upon receipt of the signal issued by the bubble sensor 80, the controller generates a drive control signal that opens valve 34 and closes valve 33. To this end, the valves 33 and 34 may be pneumatically controlled or solenoid valves. Alternatively, though, the valves 33 and 34 may be manually operated valves. In this case, the signal generated by the bubble sensor 80 (or 81, as the case may be) is discernable by a technician who positions the valves 33 and 34 accordingly.

Also, nitrogen gas is supplied under pressure to the supply vessel 11 through line 14 while the valve 34 is being opened. Bubbles are discharged from the line 16 and second tank 21 through line 24 and drain valve 28 due to the pressure created by the nitrogen gas. However, as described earlier, micro bubbles remain entrained within the photosensitive solution in the second tank 21.

Nonetheless, the micro bubbles will not reach the line 44 because the bubble removal filter 71 filters the micro bubbles. Referring to FIG. 4, micro bubbles MA remaining in the buffer tank 21 are subsequently removed by the bubble removal filter 70 when the photosensitive solution is drawn out of the tank by the operation of the pump 42. Hence, bubbles are not contained in the photosensitive solution discharged through nozzle 52, whereby the flow rate of the photosensitive solution being dispensed remains steady.

Each of the bubble removal filters 70 and 71 comprises a filtering medium having a pitch small enough to remove the micro bubbles and yet allow the photosensitive solution to pass therethrough. Also, each of the bubble sensors 80 and 81 comprises a contact-type of proximity sensor which can detect micro bubbles within the buffer tank more accurately than the optical sensors of the prior art. Each bubble sensor 80, 81 is installed within the buffer tank roughly at the center of the upper part thereof.

According to the present invention as described above, when a supply vessel of a photosensitive solution dispensing apparatus is changed, micro bubbles in photosensitive solution forced from a buffer tank of the apparatus are filtered. Thus, the photosensitive solution dispensed onto a wafer from the nozzle of the apparatus is free of bubbles. Accordingly, a photosensitive layer is formed uniformly on the wafer. This, in turn, ensures that a pattern free of defects, can be formed on the wafer.

Finally, although the present invention was described above in connection with the preferred embodiments thereof, various changes to and modifications of the present invention will become readily apparent to those skilled in the art. For example, although the present invention was described in connection with a method of and apparatus for dispensing a photosensitive solution onto a wafer, the present invention is also applicable to other chemical solution coating processes such as an HMDS solution deposition process or a dielectric layer coating process. Such a dielectric layer may be a spin on glass layer (SOG) or field oxide (FOX) layer. Still further, the bubble removal filters of the present invention may have a structure different from that described above or may be installed at a position other than that shown and described with reference to FIGS. 3 and 4. Thus, these and other changes and modifications are seen to be within the true spirit and scope of the invention as defined by the appended claims.

What is claimed is:

1. A chemical solution dispensing apparatus, comprising:
a supply vessel in which solution to be dispensed is stored;
a buffer tank having an inlet and an outlet, the supply vessel being connected to the inlet of the buffer tank such that solution flows into the buffer tank from the supply vessel in the apparatus;
a pump having an inlet and an outlet, the inlet of the pump being connected to the outlet of the buffer tank so that the pump is operative to pump solution out of the buffer tank through the outlet of the buffer tank;
a filter unit connected to the outlet of the pump so as to receive the solution pumped from the buffer tank, said filter unit having a filter that filters the solution issuing from the outlet of the pump; and
a bubble removal filter interposed between and connecting the outlet of the buffer tank and the inlet of the pump such that solution passing from the buffer tank passes through the bubble removal filter before flowing into the pump, said bubble removal filter being configured to remove air bubbles from the solution before the solution flows into the pump.

2. The apparatus of claim 1, and further comprising a bubble sensor disposed in the buffer tank, the bubble sensor being operative to sense the amount of air bubbles within the buffer tank.

3. The apparatus of claim 2, wherein the bubble sensor is a contact type of proximity sensor capable of detecting the amount of air bubbles within the buffer tank.

4. The apparatus of claim 1, and further comprising a source of nitrogen gas connected to the supply vessel.

5. The apparatus of claim 1, and further comprising a respective valve that is disposed in-line between the bubble removal filter and the pump, said valve being movable between positions at which solution is allowed to flow from the buffer tank to the pump and is prevented from flowing from the buffer tank to the pump, respectively.

6. A method of dispensing a chemical solution onto a substrate, comprising:
providing a supply vessel containing a supply of the chemical solution to be dispensed;
supplying the solution from the supply vessel to a buffer tank and buffering a volume of the solution in the buffer tank;
subsequently pumping the solution from the buffer tank and through a line leading from the buffer tank to a nozzle oriented towards the substrate;
filtering air bubbles out of the solution after the solution has been pumped from the buffer tank and into the line leading to the nozzle; and
subsequently dispensing the solution through the nozzle, whereby solution that is substantially free of air bubbles is dispensed onto the substrate.

7. The method of claim 6, wherein said supplying the solution from the supply vessel to a buffer tank comprises injecting nitrogen gas into the supply vessel.

8. The method of claim 6, wherein said filtering air bubbles out of the solution comprises directing the solution through a filtering medium that allows the solution to pass therethrough while preventing air bubbles from passing therethrough.

9. The apparatus of claim 1, further comprising a nozzle, and a line connecting the filter unit to the nozzle such that solution filtered by the filter unit is ejected by the nozzle.

* * * * *